US008851831B2

(12) United States Patent
Sun

(10) Patent No.: US 8,851,831 B2
(45) Date of Patent: Oct. 7, 2014

(54) AIR DAM MODULE AND ELECTRONIC DEVICE HAVING THE SAME

(75) Inventor: Zheng-Heng Sun, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 172 days.

(21) Appl. No.: 13/564,738

(22) Filed: Aug. 2, 2012

(65) Prior Publication Data

US 2013/0258590 A1    Oct. 3, 2013

(30) Foreign Application Priority Data

Mar. 29, 2012    (CN) .......................... 2012 1 0087535

(51) Int. Cl.
*F01B 25/02* (2006.01)
*F24F 7/06* (2006.01)
*H05K 7/20* (2006.01)

(52) U.S. Cl.
USPC ........... 415/146; 454/184; 454/351; 454/353; 454/347; 454/358; 361/679.49; 361/679.51; 361/695; 415/213.1

(58) Field of Classification Search
USPC ........ 361/679.46–679.54, 688–723; 454/184, 454/351, 353, 347, 358; 415/213.1, 146
See application file for complete search history.

(56) References Cited

U.S. PATENT DOCUMENTS

| 2,034,587 | A  | * | 3/1936  | Maxwell ........................ 454/155 |
| 5,090,445 | A  | * | 2/1992  | Jackson ..................... 137/527.8 |
| 7,025,086 | B2 | * | 4/2006  | Maeda et al. .............. 137/512.1 |
| 7,302,967 | B2 | * | 12/2007 | Maeda et al. .............. 137/512.1 |
| 7,535,709 | B2 | * | 5/2009  | Fan et al. ...................... 361/695 |
| 8,007,228 | B2 | * | 8/2011  | Wang ........................... 415/146 |
| 8,057,161 | B2 | * | 11/2011 | Seidler ........................... 415/26 |
| 8,414,368 | B2 | * | 4/2013  | Hansen et al. ................ 454/351 |
| 8,475,119 | B2 | * | 7/2013  | Li ................................ 415/147 |
| 8,668,435 | B2 | * | 3/2014  | Weisser et al. ................. 415/26 |
| 2013/0258591 | A1 | * | 10/2013 | Sun et al. ....................... 361/695 |
| 2013/0260665 | A1 | * | 10/2013 | Sun ............................... 454/184 |

* cited by examiner

*Primary Examiner* — Zachary M Pape
(74) *Attorney, Agent, or Firm* — Novak Druce Connolly Bove + Quigg LLP

(57) ABSTRACT

An electronic device includes an air dam module. The air dam module includes a frame defining a vent, a first rotating member, a second rotating member, and two third rotating members. The first rotating member is rotatably connected to a surface bounding the vent, to vertically block a lower half of the vent by its gravity. The second rotating member is rotatably connected to the surface bounding the vent. The third rotating members are rotatably connected to opposite ends of the second rotating member. The second and third rotating members vertically block an upper half of the vent by their gravities.

18 Claims, 4 Drawing Sheets

AIR DAM MODULE AND ELECTRONIC DEVICE HAVING THE SAME

BACKGROUND

1. Technical Field

The present disclosure relates to an electronic device including an air dam module.

2. Description of Related Art

Fans are mounted in an electronic device for dissipating heat from electronic components in the electronic device. However, when a fan is broken down, it causes air back flowing and turbulence, which will adversely influence heat dissipation from the electronic device.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one".

Figure 1:
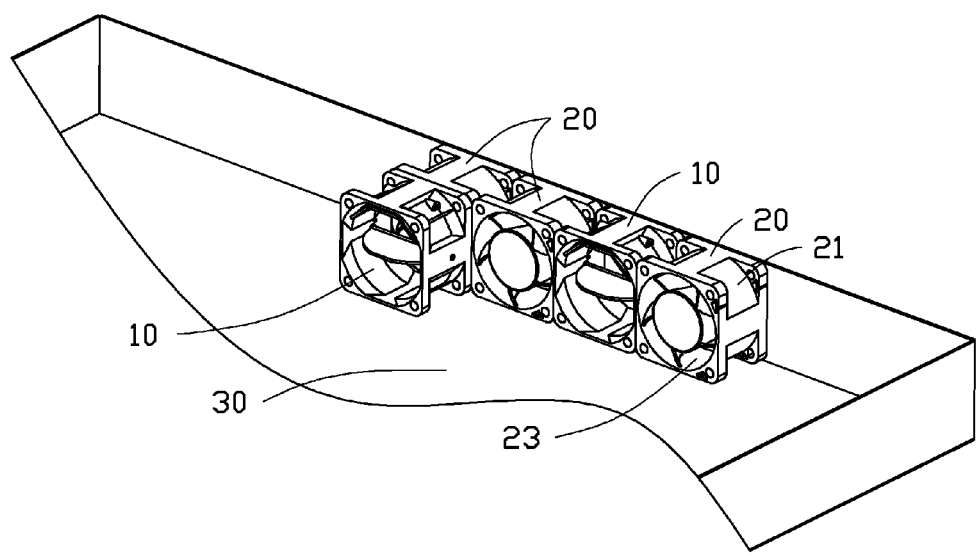
FIG. 1 is a partial, assembled, isometric view of an exemplary embodiment of an electronic device, wherein the electronic device includes a plurality of air dam modules.
Figure 2:
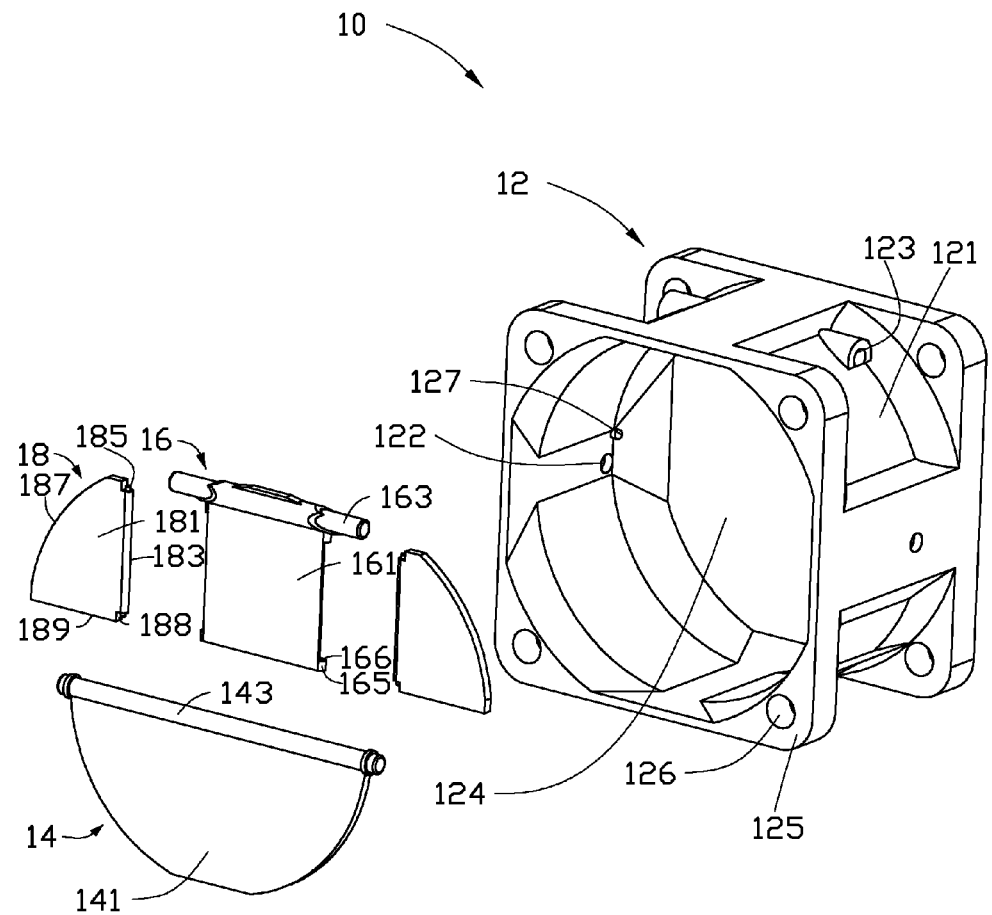
FIG. 2 is an exploded, isometric view of one of the air dam modules of FIG. 1.

FIGS. 1 and 2 show an exemplary embodiment of an electronic device. The electronic device includes a chassis 30, a plurality of standard fans 20, and a plurality of air dam modules 10.

Each standard fan 20 includes a first frame 21 defining a first vent 23 having a substantially circular cross section.

Each air dam module 10 includes a second frame 12, a first rotating member 14, a second rotating member 16, and two third rotating members 18.

The second frame 12 has the same shape and size as the first frame 21 of each standard fan 20. The second frame 12 includes a columnar main body 121, and two fixing plates 125 respectively at front and rear ends of main body 121. A second vent 124 having a substantially circular cross section is axially defined in the main body 121, extending through the fixing plates 125. A cross-sectional area of the second vent 124 is equal to a cross-sectional area of the first vent 23 of each standard fan 20. Four fixing holes 126 are defined in the four corners of each fixing plate 125. Therefore, the second frame 12 has the same manner of mounting as the standard fans 20.

Middles of opposite sides of the main body 121 each define a first pivot hole 122 communicating with the second vent 124. Tops of the opposite sides of the main body 121 each define a second pivot hole 123 communicating with the second vent 124. The first and second pivot holes 122 and 123 are arranged in a same vertical plane. A block 127 protrudes into the second vent 124 from an inner surface of each of the opposite sides of the main body 121, above and behind the corresponding one of the first pivot holes 122.

The first rotating member 14 includes a substantially semi-circular first shield plate 141 and a first pivot 143. The top side of the first shield plate 141 is a straight edge. The first pivot 143 is connected to the top side of the first shield plate 141, and opposite ends of the first pivot 143 protrude out of opposite ends of the first shield plate 141. A perpendicular distance between the first pivot 143 and the bottom side of the first shield plate 141 is equal to or less than a perpendicular distance between the first pivot holes 122 and the fixing plate 125 at the front end of the second frame 12.

The second rotating member 16 includes a substantially quadrate second shield plate 161 and a second pivot 163 connected to the top side of the second shield plate 161. Opposite ends of the second pivot 163 protrude out of opposite ends of the second shield plate 161. Upper and lower sections of the opposite ends of the second shield plate 161 each form a pivot portion 165. A hole 166 is defined in each pivot portion 165, extending from top to bottom. A perpendicular distance between the second pivot 163 and the bottom side of the second shield plate 161 is equal to or less than a perpendicular distance between the second pivot holes 123 and the fixing plate 125 at the front end of the second frame 12.

Each third rotating member 18 includes a third shield plate 181 substantially in the shape of a quadrant. The third shield plate 181 includes a vertical edge 188, a bottom edge 189 perpendicular to the vertical edge 188, and an arc-shaped edge 187 connected between the vertical edge 188 and the bottom edge 189. A length of the vertical edge 188 is equal to a length between the top side and the bottom side of the second shield plate 161. A vertical flange 183 is formed on an outer surface of the vertical edge 188. A pole 185 vertically protrudes from each of the top and the bottom of the vertical flange 183.

Figure 3:
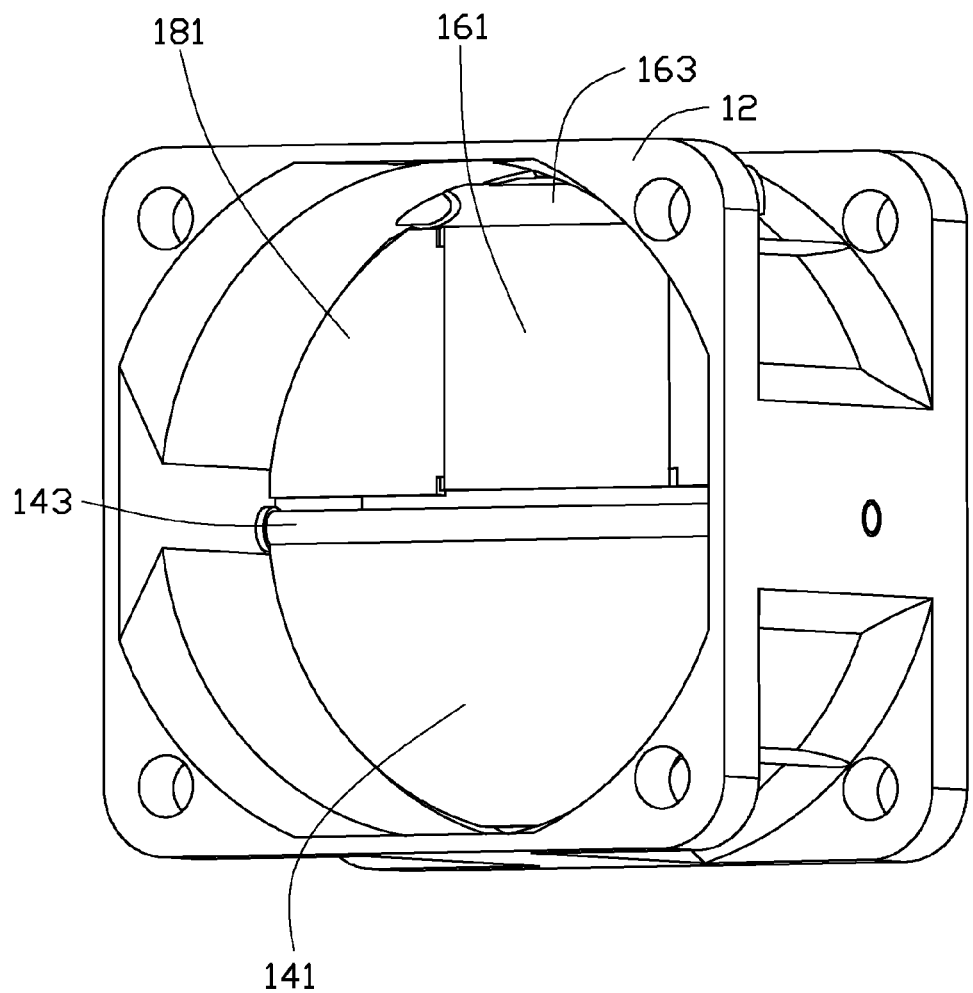
FIGS. 3 and 4 are assembled, isometric views of the air dam module of FIG. 2 from different perspectives, and in different states.

Referring to FIG. 3, to assemble one air dam module 10, the first pivot 143 is deformed to be received in the vent 124, to allow the opposite ends of the first pivot 143 to align with the first pivot holes 122. The first pivot 143 is restored, to allow the opposite ends of the first pivot 143 to rotatably engage in the first pivot holes 122. Thereby, the first rotating member 14 is rotatably received and held captive in the vent 124. The first shield plate 141 hangs vertically under the first pivot 143 by gravity, and blocks the lower half of the vent 124. The bottom side and the opposite ends of the first shield plate 141 abut portions of the second frame 12 bounding the lower half of the vent 124.

The third rotating members 18 are rotatably connected to the opposite ends of the second shield plate 161, to allow the poles 185 of each third rotating member 18 to be rotatably engaged in the holes 166 of one of the opposite ends of the second shield plate 161. The second pivot 163 is deformed to be received in the vent 124, to allow the opposite ends of the second pivot 163 to align with the second pivot holes 123. The second pivot 163 is restored, to allow the opposite ends of the second pivot 163 to rotatably engage in the second pivot holes 123. Thereby, the second rotating member 16 is rotatably received and held captive in the vent 124. The second shield plate 161 and the third shield plates 181 hang vertically by gravity, and block the upper half of the vent 124. The arc-shaped edges 187 abut portions of the second frame 12 bounding the upper half of the vent 124. The bottom edges 189 and the bottom side of the second shield plate 161 abut the top of the first pivot 143. The blocks 127 abut the rear sides of the third shield plates 181, to prevent the third rotating members 18 from rotating to the rear. The first, second, and third rotating members 14, 16, and 18 block the vent 124, and will prevent air back flowing towards the air dam module 10.

Figure 4:
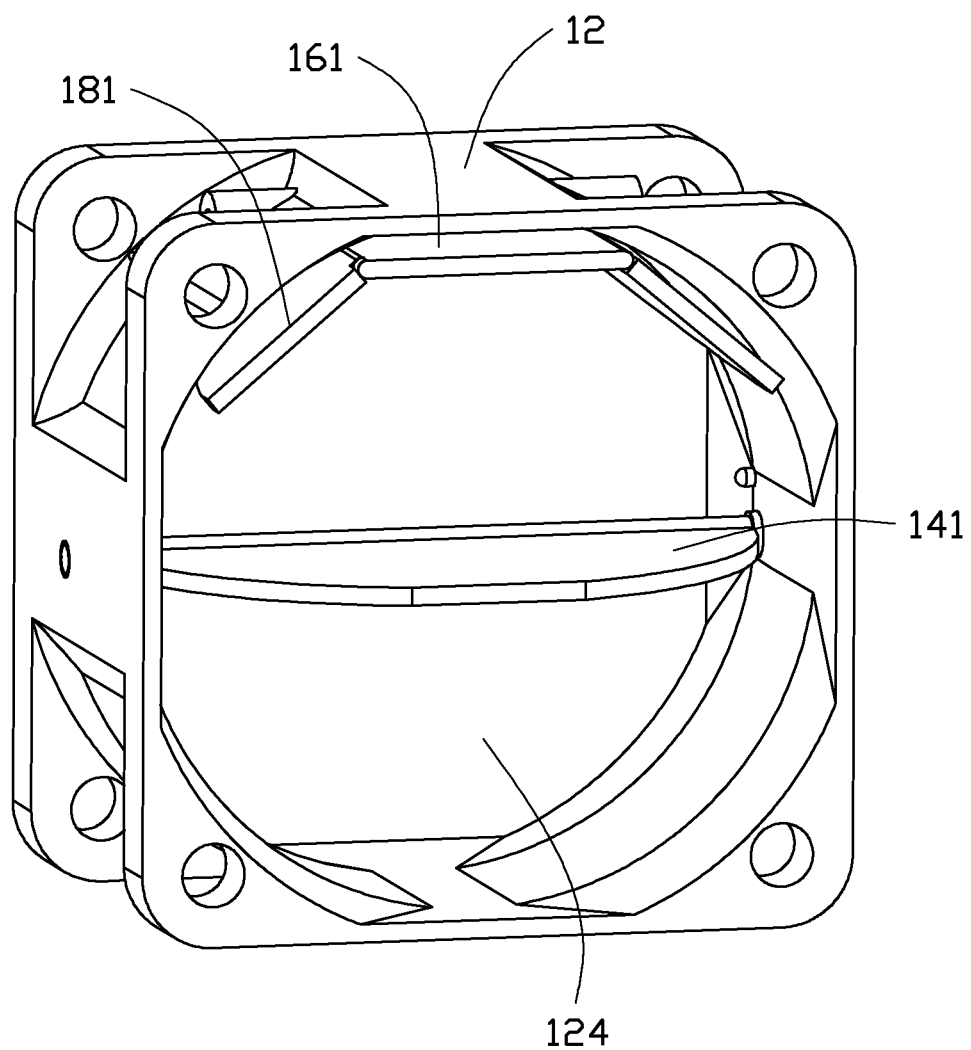

Referring to FIG. 4, when an airflow from a standard fan 20 is blown forward towards the air dam module 10, the first and second rotating members 14 and 16 rotate forward 90 degrees around the first and second pivot holes 122 and 123. The third rotating members 18 rotate forward along with the second rotating member 16. Portions of the second frame 12 bounding the upper half of the vent 124 abut against the arc-shaped edges 187, to drive the third rotating members 18 to rotate toward the second rotating member 16 about the pivot portions 165. The third rotating members 18 abut against top portions of inner surfaces of the opposite sides of the second frame 12. The first, second, and third rotating members 14, 16, and 18 are completely received in the vent 124 all the time, and will never extend out of the frame 12 to take up outside space.

Referring to FIG. 1, before a replacement for a broken down standard fan 20 in the chassis 30 is fitted, an air dam module 10 can replace the broken down standard fan 20 to be mounted in the chassis 30. The first, second, and third rotating members 14, 16, and 18 are vertical by means of gravity, and so block the vent 124, which will prevent air back flowing towards the air dam module 10.

If there is enough space in the chassis 30, an air dam module 10 can be mounted to a front end of a standard fan 20. When the standard fan 20 operates, the first, second, and third rotating members 14, 16, and 18 are blown by the standard fan 20 to rotate forward, to allow almost all the airflow produced by the standard fan 20 to pass through the vent 124. When the standard fan 20 is broken-down, the first, second, and third rotating members 14, 16, and 18 are vertically arranged in the air dam module 10 by gravity, and block the vent 124, which will prevent air back flowing towards the air dam module 10.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. An air dam module, comprising:
a frame axially defining a vent through a front end and a rear end of the frame, the vent defining a substantially circular cross section;
a first rotating member received in the vent, wherein a top side of the first rotating member is rotatably connected to a surface bounding the vent, the first rotating member comprises a substantially semicircular first shield plate vertically blocking a lower half of the vent upon a condition that its blocking position is not overcome by an airflow passing through the vent;
a second rotating member received in the vent, wherein a top side of the second rotating member is rotatably connected to the surface bounding the vent, the second rotating member comprises a substantially quadrate second shield plate; and
two sector-shaped third rotating members, each having an arched side, rotatably connected to opposite ends of the second shield plate with the arched sides being adjacent to the surface bounding the vent, wherein the second shield plate and the third shield plates vertically block an upper half of the vent upon a condition that their blocking positions are not overcome by an airflow passing through the vent.

2. The air dam module of claim 1, wherein a bottom side and two opposite ends of the first shield plate abut portions of the frame bounding the lower half of the vent, the arched sides of the third shield plates abut portions of the frame bounding the upper half of the vent, and bottom sides of the second and third shield plates abut the top of the first rotating member, in response to the first, second, and third rotating members vertically blocking the vent.

3. The air dam module of claim 2, wherein a block protrudes from an inner surface of each of opposite sides of the frame, above and behind the first rotating member, the blocks abut rear sides of the third shield plates in response to the second and third shield plates vertically blocking the upper half of the vent.

4. The air dam module of claim 2, wherein a top side of the first shield plate is a straight edge, and a first pivot is connected to the top side of the first shield plate, middles of opposite sides of the frame each define a first pivot hole communicating with the vent, opposite ends of the first pivot are rotatably engaged in the first pivot holes.

5. The air dam module of claim 4, wherein a second pivot is connected to a top side of the second shield plate, tops of the opposite sides of the frame each define a second pivot hole communicating with the vent, opposite ends of the second pivot are rotatably engaged in the second pivot holes.

6. The air dam module of claim 5, wherein a perpendicular distance between the first pivot and the bottom side of the first shield plate is equal to or less than a perpendicular distance between the first pivot holes and a front end of the frame, a perpendicular distance between the second pivot and the bottom sides of the second and third shield plates is equal to or less than a perpendicular distance between the second pivot holes and the front end of the frame.

7. An electronic device, comprising:
a chassis; and
an air dam module comprising a frame mounted to the chassis and defining a substantially circular vent, wherein the frame has the same shape and size as a fan, the air dam module further comprises:
a first rotating member received in the vent, wherein a top of the first rotating member is rotatably connected to the frame, the first rotating member comprises a substantially semicircular first shield plate vertically blocking a lower half of the vent upon a condition that its blocking position is not overcome by an airflow passing through the vent;
a second rotating member received in the vent, wherein a top side of the second rotating member is rotatably connected to the frame, the second rotating member comprises a substantially quadrate second shield plate; and
two sector-shaped third rotating members, each having an arched side, rotatably connected to opposite ends of the second shield plate with the arched sides being adjacent to a surface bounding the vent, wherein the second shield plate and the third shield plates vertically block an upper half of the vent upon a condition that their blocking positions are not overcome by an airflow passing through the vent.

8. The electronic device of claim 7, wherein a bottom side and two opposite ends of the first shield plate abut portions of the frame bounding the lower half of the vent, the arched sides of the third shield plates abut portions of the frame bounding the upper half of the vent, and bottom sides of the second and third shield plates abut the top of the first rotating member, in response to the first, second, and third rotating members vertically blocking the vent.

9. The electronic device of claim 8, wherein a block protrudes from an inner surface of each of opposite sides of the frame, above and behind the first rotating member, the blocks abut rear sides of the third shield plates in response to the second and third shield plates vertically blocking the upper half of the vent.

10. The electronic device of claim 8, wherein a top side of the first shield plate is a straight edge, and a first pivot is connected to the top side of the first shield plate, middles of opposite sides of the frame each define a first pivot hole communicating with the vent, opposite ends of the first pivot are rotatably engaged in the first pivot holes.

11. The electronic device of claim 10, wherein a second pivot is connected to a top side of the second shield plate, tops of the opposite sides of the frame each define a second pivot hole communicating with the vent, opposite ends of the second pivot are rotatably engaged in the second pivot holes.

12. The electronic device of claim 11, wherein a perpendicular distance between the first pivot and the bottom side of the first shield plate is equal to or less than a perpendicular distance between the first pivot holes and a front end of the frame opposite to the chassis, a perpendicular distance between the second pivot and the bottom sides of the second and third shield plates is equal to or less than a perpendicular distance between the second pivot holes and the front end of the frame.

13. An electronic device, comprising:
a chassis;
a fan mounted in the chassis and comprising a first frame, the first frame defining a substantially circular first vent; and
an air dam module mounted to a front end of the fan, the air dam module comprising a second frame defining a substantially circular second vent, wherein the second frame has the same shape and size as the first frame, the air dam module further comprises:
  a first rotating member received in the second vent, wherein a top side of the first rotating member is rotatably connected to the second frame, the first rotating member comprises a substantially semicircular first shield plate vertically blocking a lower half of the second vent upon a condition that its blocking position is not overcome by an airflow passing through the vent;
  a second rotating member received in the second vent, wherein a top side of the second rotating member is rotatably connected to the second frame, the second rotating member comprises a substantially quadrate second shield plate; and
  two sector-shaped third rotating members, each having an arched side, rotatably connected to opposite ends of the second shield plate with the arched sides being adjacent to the surface bounding the vent, wherein the second shield plate and the third shield plates vertically block an upper half of the vent upon a condition that their blocking positions are not overcome by an airflow passing through the vent, the first and second rotating members rotate forward 90 degrees, and the third rotating members rotate toward the second rotating member and abut against top portions of inner surfaces of the opposite sides of the second frame, in response to the fan blowing air towards the air dam module.

14. The electronic device of claim 13, wherein a bottom side and two opposite ends of the first shield plate abut portions of the second frame bounding the lower half of the second vent, the arched sides of the third shield plates abut portions of the second frame bounding the upper half of the second vent, and bottom sides of the second and third shield plates abut the top of the first rotating member, in response to the first, second, and third rotating members vertically blocking the vent.

15. The electronic device of claim 14, wherein a block protrudes from an inner surface of each of opposite sides of the second frame, above and behind the first rotating member, the blocks abut rear sides of the third shield plates in response to the second and third shield plates vertically blocking the upper half of the vent.

16. The electronic device of claim 14, wherein a top side of the first shield plate is a straight edge, and a first pivot is connected to the top side of the first shield plate, middles of opposite sides of the second frame each define a first pivot hole communicating with the second vent, opposite ends of the first pivot are rotatably engaged in the first pivot holes.

17. The electronic device of claim 16, wherein a second pivot is connected to a top side of the second shield plate, tops of the opposite sides of the second frame each define a second pivot hole communicating with the second vent, opposite ends of the second pivot are rotatably engaged in the second pivot holes.

18. The electronic device of claim 17, wherein a perpendicular distance between the first pivot and the bottom side of the first shield plate is equal to or less than a perpendicular distance between the first pivot holes and a front end of the second frame opposite to the fan, a perpendicular distance between the second pivot and the bottom sides of the second and third shield plates is equal to or less than a perpendicular distance between the second pivot holes and the front end of the second frame.

* * * * *